United States Patent
Gramann et al.

[11] Patent Number: 5,907,151
[45] Date of Patent: May 25, 1999

[54] SURFACE MOUNTABLE OPTOELECTRONIC TRANSDUCER AND METHOD FOR ITS PRODUCTION

[75] Inventors: Wolfgang Gramann, Regensburg; Georg Bogner, Hainsacker; Ralf Dietrich, Munich; Martin Weigert, Hardt, all of Germany

[73] Assignee: Siemens Aktiengesellschaft, Munich, Germany

[21] Appl. No.: 08/863,357

[22] Filed: May 27, 1997

[30] Foreign Application Priority Data

May 24, 1996 [DE] Germany ............ 196 21 124

[51] Int. Cl.⁶ .................................. H01J 40/14
[52] U.S. Cl. ................... 250/214.1; 250/239; 257/81
[58] Field of Search .............. 250/214.1, 214 R, 250/216, 239; 257/433, 434, 80–84

[56] References Cited

U.S. PATENT DOCUMENTS

| | | |
|---|---|---|
| 4,247,864 | 1/1981 | Lockard . |
| 5,298,742 | 3/1994 | Friauf et al. ............ 250/239 |
| 5,350,916 | 9/1994 | Bierhoff et al. ............ 250/214.1 |
| 5,565,674 | 10/1996 | Reele ............ 250/216 |

FOREIGN PATENT DOCUMENTS

| | | |
|---|---|---|
| 0145316B1 | 3/1993 | European Pat. Off. . |
| 4242842A1 | 8/1993 | Germany . |

*Primary Examiner*—Que T. Le
*Attorney, Agent, or Firm*—Herbert L. Lerner; Laurence A. Greenberg

[57] ABSTRACT

An optoelectronic transducer has a radiation-emitting and/or radiation-receiving body on a carrier unit. The carrier unit has a mounting surface provided with a number of terminal parts. The terminal parts are provided with electrical terminal areas defining a contacting plane. The distance of the contacting plane from the mounting surface is greater than a maximum height of the body from the mounting surface, including all optional electrical conductors and covers.

19 Claims, 6 Drawing Sheets

SURFACE MOUNTABLE OPTOELECTRONIC TRANSDUCER AND METHOD FOR ITS PRODUCTION

BACKGROUND OF THE INVENTION

FIELD OF THE INVENTION

The invention relates to an optoelectronic transducer having a radiation-emitting and/or radiation-receiving body, which is fastened on a carrier unit. The invention relates in particular to an optoelectronic transducer of this type in which the radiation-emitting and/or radiation-receiving body is a semiconductor chip or a polymer luminescence diode or laser diode.

Description of the Related Art

An optoelectronic transducer of this type is disclosed, for example, in U.S. Pat. No. 5,255,333 (corr. European Patent EP 4 12 184 B1) and is illustrated herein in FIG. 12. That prior art optoelectronic transducer is a radiation detector configuration with a detector component, for example a photodiode. A common carrier is provided, an insulating body, a fastening part, a lens carrier and a lens for focusing the radiation received by the detector component. The detector component is fastened by its underside on the insulating body, which is in turn fastened to the common carrier. The fastening part is disposed next to the insulating body on the common carrier. The lens carrier with the lens is fixed on the fastening part by means of a fastening layer in such a way that the lens is situated above the beam entry face of the detector component.

The mounting of the individual components of such an optoelectronic transducer is very complicated. It requires a large number of method steps and the adjustment of the lens is quite difficult. Moreover, large reflection losses and/or imaging errors generally occur within the transducer on account of the air gap between the lens and the detector component.

There has also become known, from German Offenlegungsschrift DE 43 23 681, an optoelectronic transducer in which an optical receiving or transmitting element is arranged on one side of a transparent carrier and a deflection mirror arrangement and an optical fiber running parallel to the longitudinal axis of the carrier are arranged on the other side of the carrier. The light emitted, for example, by an optical transmitting element passes through the common carrier, is deflected at the deflection mirror arrangement through 90° in the direction of the optical fiber and is coupled into the latter. In the case of a receiving element, the light signal arriving through the optical fiber is deflected at the deflection mirror arrangement through 90° in the direction of the receiving element, subsequently passes through the common carrier and is coupled into the receiving element.

The production of that prior art configuration also brings with it increased mounting and adjustment complexity. Conventional methods for mounting semiconductor components on a printed circuit board cannot be used in that configuration.

SUMMARY OF THE INVENTION

It is accordingly an object of the invention to provide an optoelectronic transducer and a corresponding production method, which overcomes the above-mentioned disadvantages of the heretofore-known devices and methods of this general type and which transducer can be mounted using conventional component mounting methods and which is suitable, in particular, for surface mounting. In other words, the novel transducer is to be fastenable on a printed circuit board using SMD technology (Surface Mounted Device).

It is a further object to also ensure that the novel optoelectronic transducer can be produced in a simple manner in large quantities and that it can be adjusted exactly, without high complexity, with respect to further optical devices, and will also have high efficiency when coupling out light.

With the foregoing and other objects in view there is provided, in accordance with the invention, an optoelectronic transducer, comprising:

a carrier having a mounting surface;

at least one radiation-emitting and/or radiation-receiving body fastened on the mounting surface of the carrier, the body having an electrical contact;

a plurality of terminal parts assigned to the mounting surface, the terminal parts having electrical terminal areas each electrically conductively connected to the electrical contact of the body; and the terminal parts defining a contacting plane spaced from the mounting surface by a given distance, the body having a maximum height, measured from the mounting surface, less than the given distance from the mounting surface to the contact-making plane.

In accordance with an additional feature of the invention, there are provided electrical connectors connecting the electrical terminal areas with the electrical contact of the body; the height of the body measured from the mounting surface thereby includes the electrical connectors.

In other words, the optoelectronic transducer of the type mentioned above has a carrier unit with a mounting surface on which the radiation-emitting and/or radiation-receiving body is fastened. The mounting surface is assigned a number of terminal parts with electrical terminal areas which are provided for the surface mounting of the component on a printed circuit board, for example. Each of the terminal parts is electrically conductively connected by an electrical connector to an electrical contact of the body. The terminal parts are constructed and disposed next to the body in such a way that, referred to the mounting surface, the maximum height of the body including all the connecting means, and an optional cover for the body, is smaller than the distance between the mounting surface and a contacting plane defined by the terminal areas.

The optoelectronic transducer according to the invention has the advantage over the prior art transducers in that it can be fastened in a simple manner on a printed circuit board (for example a circuit board, a ceramic substrate or a hybrid substrate) in that it is placed by its terminal areas onto conductor tracks of the printed circuit board and the terminal areas are connected to the conductor tracks by means of an electrically conductive adhesive or other mounting binder. Consequently, the transducer can, for example, be mounted on a printed circuit board in such a way where the body is disposed between the carrier part and the printed circuit board.

In accordance with other features of the invention, the body is a semiconductor chip, polymer luminescence diode, or a laser diode.

In accordance with an additional feature of the invention, the body is formed with a radiation port oriented towards the carrier unit, and the carrier unit is composed of a material which is transparent to at least a portion of a radiation emitted and/or received by the body.

This has the particular advantage that the radiation which is emitted and/or received by the body can be coupled without great reflection losses and losses due to imaging errors into an optical fiber or into another optical arrangement and/or into the body.

In accordance with a further feature of the invention, the carrier unit includes a carrier plate which is formed with a recess; the mounting surface is located on the bottom of the recess, and the recess has side walls at least partially defining the terminal parts. The particular advantage of this embodiment is that a plurality of optoelectronic transducers according to the invention can be produced simultaneously in a wafer in a simple manner. Separate, exact positioning and mounting of the terminal parts on the carrier plate is not necessary.

In a preferred embodiment, the carrier plate is formed of insulating material, and the assembly includes a plurality of electrically conductive terminal tracks connected to the electrical contacts of the body, the terminal tracks being disposed in the recess and on the terminal parts and being structured in such a way that a number of terminal surfaces are formed on the terminal parts. Alternatively, there is provided an insulating layer disposed in the recess and on the terminal parts, and a plurality of electrically conductive terminal tracks connected to the electrical contacts of the body, the terminal tracks being disposed on the insulating layer and forming terminal surfaces on the terminal parts, which are suitable for surface mounting of the component. This has the advantage, in particular, that the electrically conductive terminal tracks can be produced in a simple manner by means of conventional methods of semiconductor technology (mask technology plus vapor deposition, or sputtering of metal layers, etc.).

In accordance with again an added feature of the invention, the carrier unit includes means for focusing the radiation.

In accordance with again an additional feature of the invention, the carrier plate is formed of electrically insulating material, and the transducer assembly includes at least two structured metallization layers on the carrier plate, and electrically conductive terminal parts disposed on the carrier plate.

In accordance with again another feature of the invention, an insulating layer covers the carrier plate at least partially, and at least two structured metallization layers on the insulating layer are provided, and electrically conductive terminal parts are disposed on the carrier plate.

This has the particular advantage that the dimensions and the positions of the electrically conductive terminal parts can be matched in a simple manner to the dimensions of the radiation-emitting and/or radiation-receiving body situated on the mounting surface (if appropriate, including the connecting conductors and/or the cover for the body).

In accordance with yet an added feature of the invention, the carrier plate has a given refractive index, and there is provided a further plate disposed on the carrier plate on a side thereof opposite from the body, the further plate having a refractive index different from the given refractive index.

As a result, it is possible to produce the carrier unit from materials having different refractive indices and thereby to optimize the structural height and the optical imaging of the optoelectronic transducer.

In accordance with yet additional features of the invention, the further plate includes radiation focussing means, with which the emitted and/or received radiation can be coupled out of the transducer and/or coupled into the latter without large losses due to total reflection at the various interface boundaries.

In accordance with a concomitant feature of the invention, there is provided a cover or cover layer disposed on at least the radiation-emitting and/or radiation-receiving body. The cover may be plastic or the like, and it protects the body in a simple manner against moisture and against mechanical damage.

With the above and other objects in view there is also provided, in accordance with the invention, a method of producing a plurality of optoelectronic transducers, which comprises:

a) forming a plurality of electrically conductive terminal tracks on a substrate, the terminal tracks defining a plurality of mounting surfaces;

b) mounting on the mounting surfaces a plurality of radiation-emitting and/or radiation-receiving bodies with electrical contacts, and electrically conductively connecting the electrical contacts of the bodies to respective terminal tracks; and c) placing a plurality of terminal parts on the substrate such that the terminal parts are each at least partially disposed on a respective terminal track and a height of the terminal parts measured from the mounting surfaces is greater than a height of the bodies.

In a further mode of the invention, an insulating layer is placed on the substrate prior to the forming step, and the bodies are mounted on the insulating layer.

In accordance with a further mode of the invention a process is proposed which includes the steps of:

a) forming in a substrate a plurality of recesses with mounting surfaces;

b) producing a plurality of electrical terminal tracks with terminal areas on the substrate;

c) mounting a plurality of radiation-emitting and/or radiation-receiving bodies on the mounting surfaces in the recesses, and electrically connecting the bodies to the terminal tracks; and d) dividing and separating, such as sawing, the substrate into individual optoelectronic transducers.

Other features which are considered as characteristic for the invention are set forth in the appended claims.

Although the invention is illustrated and described herein as embodied in an optoelectronic transducer and method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 12:
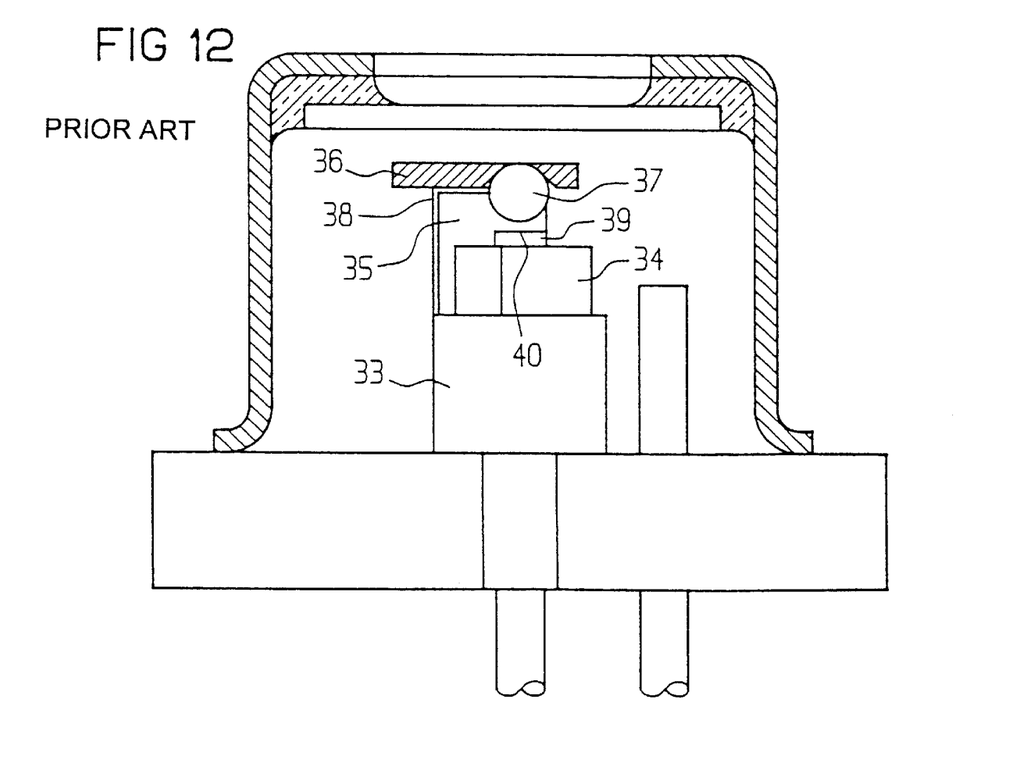
FIG. 12 is a diagrammatic sectional view taken through a prior art optoelectronic transducer according to U.S. Pat. No. 5,255,333.

Referring now to the figures of the drawing in detail and first, particularly, to the illustration in FIG. 12 of an optoelectronic transducer according to U.S. Pat. No. 5,255,333 (herein incorporated by reference), there is seen a radiation detector configuration with a detector component 39, for example a photodiode, a common carrier 33, an insulating body 34, a fastening part 35, a lens carrier 36 and a lens 37 for focusing the radiation received by the detector component 39. The detector component 39 is fastened by its underside on the insulating body 34, which is in turn fastened to the common carrier 33. The fastening part 35 is disposed next to the insulating body 34 on the common carrier 33. The lens carrier 36 with the lens 37 is fixed on the fastening part 35 by means of a fastening layer 38 in such a way that the lens 37 is situated above the beam entry face 40 of the detector component 39.

Figure 1:
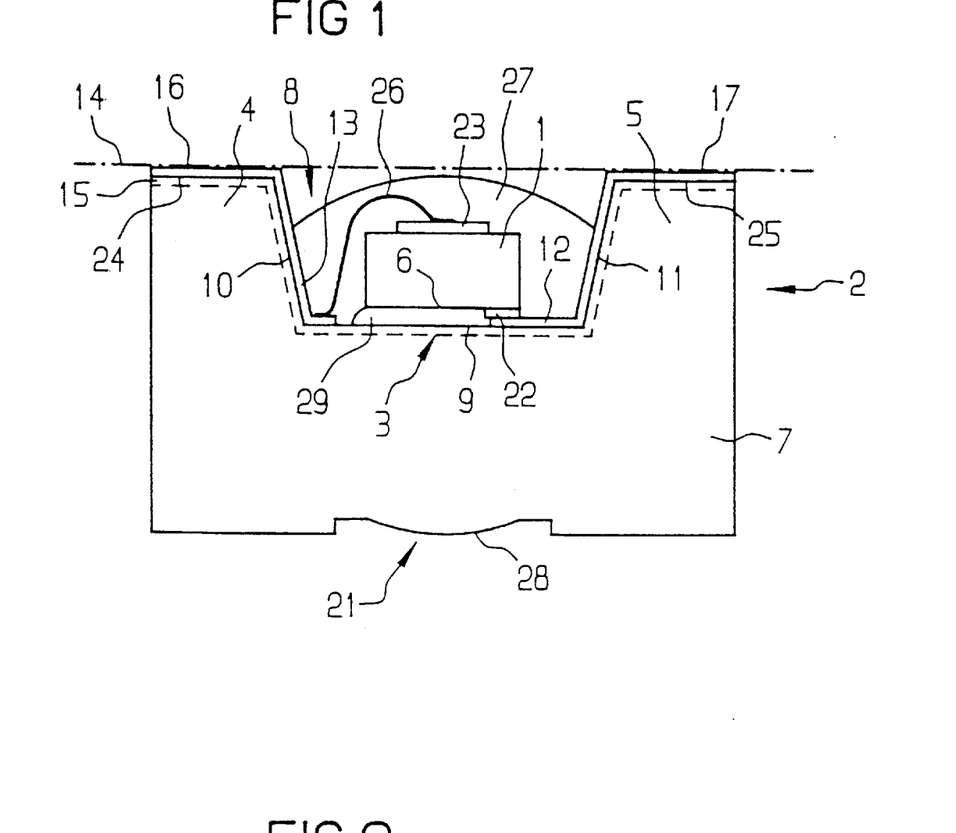
FIG. 1 is a diagrammatic sectional view taken through a first exemplary embodiment of an optoelectronic transducer according to the invention.
Figure 2:
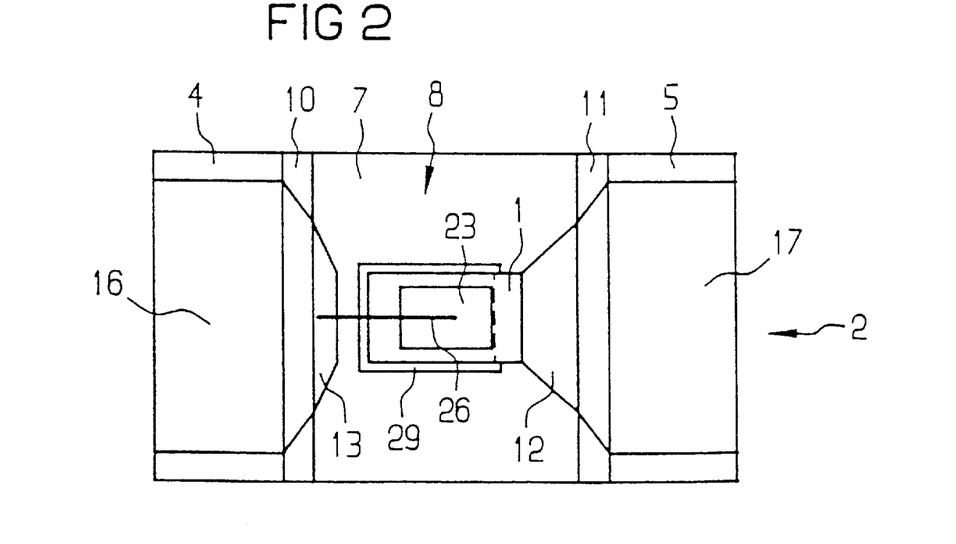
FIG. 2 is a diagrammatic plan view thereof.

Referring now more particularly to the illustration of a first embodiment of the novel optoelectronic transducer in FIGS. 1 and 2, the carrier unit 2 has a substrate or carrier plate 7 with a trapezoidal recess 8. Two mutually separate electrically conductive terminal tracks 12, 13, for example in the form of metallization layers, are applied to a bottom or floor 9 and to the sides or walls 10, 11 of the recess 8. The tracks 12, 13 further extend to the top sides 24, 25 of terminal parts 4, 5. As a result, two terminal areas 16, 17 of the optoelectronic transducer are formed on the terminal parts 4, 5.

A radiation-emitting and/or radiation-receiving body 1 is fastened on a mounting surface 3 of the recess 8 in such a way that an underside contact 22 of the body 1 at least partially rests on the electrically conductive terminal track 12. The body 1 is thereby connected to the track 12 by means of AuSn solder, for example, or by means of another suitable electrically conductive connector. A top side contact 23 of the body 1 is connected to the electrically conductive terminal track 13 by means of a connecting conductor 24 (for example a bonding wire).

The body 1 is, for example, a light-emitting diode, a photodiode (PIN photodiode) or a vertical cavity surface emitting laser (VCSEL).

The carrier plate 7 is an electrical insulator and it is composed, for example, of a glass, plastic, sapphire, diamond or semiconductor material which is transparent to the radiation emitted and/or received by the body 1. For example SiC can be used for wavelengths $\lambda > 400$ nm, GaP can be used for $\lambda > 550$ nm, GaAs can be used for $\lambda > 900$ nm and silicon can be used for $\lambda > 1100$ nm. The recess 8 is produced, for example, by means of etching, sawing or milling. It is also possible to use an electrically conductive carrier plate 7, which is composed, for example, of metal but is then at least partially provided with an insulating layer 15 (for example an oxide layer or plastic layer, etc.) in the recess and on the terminal parts 4, 5.

The electrically conductive terminal tracks 12, 13 are composed, for example, of aluminum, an aluminum base alloy or an Au multilayer system. It is also possible—if a carrier plate 7 made of a semiconductor material is used—to form terminal tracks in the recess 8 and also on the top sides 24, 25 of the terminal parts 4, 5 by means of suitable doping. The processes currently employed by those skilled in the art of semiconductor technology, such as ion implantation, for example, can be used to produce doping of this type.

An optical coupling medium 29, for example a casting resin, is situated between the radiation exit and/or entry face 6 (the radiation port 6) of the body 1 and the carrier plate 7. This improves the coupling of light out of the body 1 and/or out of the carrier plate 7. The improvement in the coupling out of light is based on increasing the angle at which total reflection occurs. As an essential property, the coupling medium 29 has only low absorption of the radiation which is emitted and/or received by the semiconductor chip 1.

For the sake of completeness, it may be mentioned at this point that the radiation exit and/or entry face 6 of the radiation-emitting body 1 is that face through which the majority of the radiation generated in the body 1 exits from the latter. Analogously to this, the radiation entry face of a radiation-receiving body 1 is that face through which received radiation enters the body 1.

The terminal areas 16, 17 define a contacting plane or contact-making plane (indicated by the dot-dashed line 14), the distance of which from the trench floor 9 is greater than the maximum height of the body 1 including the connecting conductor 26 and an optionally provided chip cover 27, which is composed, for example, of a resin filled with quartz globules or flakes or of an acrylate. The chip cover 27 is used, in particular, to protect the body 1 against moisture and against mechanical damage.

On its side opposite the recess 8, the carrier plate 7 has a means 21 for focusing the radiation which is emitted and/or received by the body 1, for example a spherical lens, an aspherical lens or a diffraction optical system. This can be formed in the carrier plate 7, for example by means of etching or grinding, or be produced separately and applied to the carrier plate 7, for example by means of soldering, adhesive bonding or anodic bonding.

Figure 3:
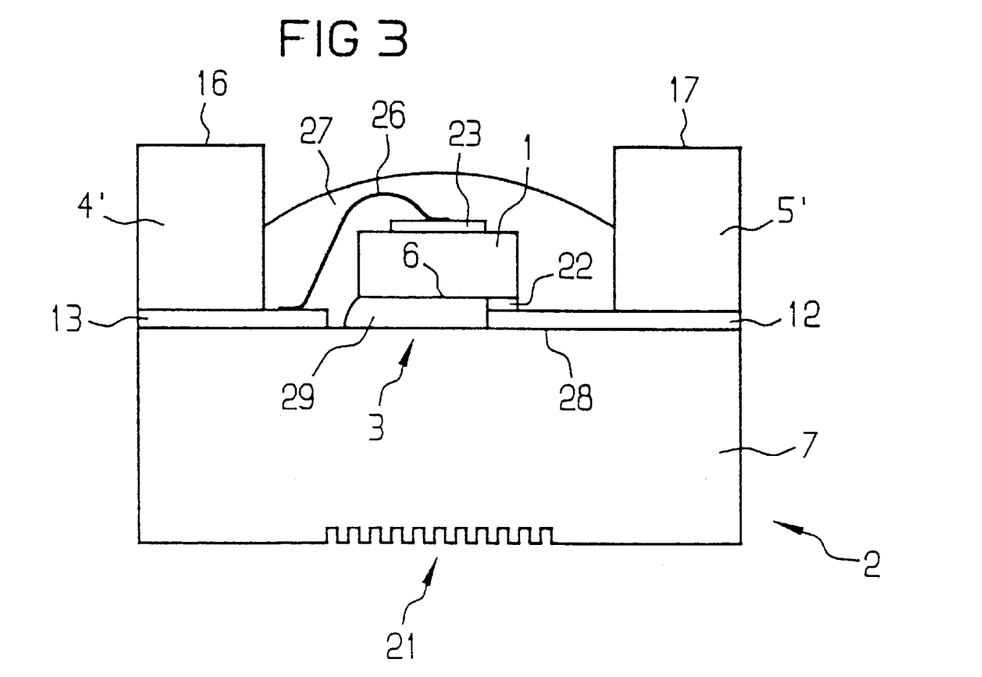
FIG. 3 is a diagrammatic sectional view taken through a second exemplary embodiment of an optoelectronic transducer according to the invention.
Figure 4:
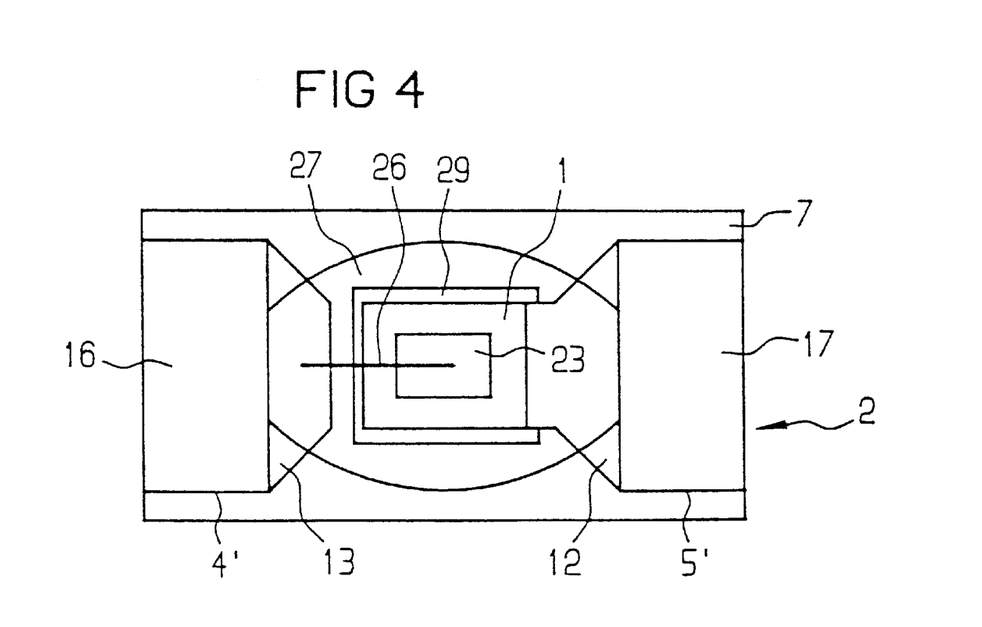
FIG. 4 is a diagrammatic a plan view of the optoelectronic transducer of FIG. 3.

In the optoelectronic transducer illustrated in FIGS. 3 and 4, the carrier plate 7 has a planar top side 28, to which the electrically conductive terminal tracks 12, 13 are applied. The carrier plate 7 may be produced from an electrically insulating material (for example a material as in the above exemplary embodiment of FIGS. 1 and 2) or may be electrically conductive, in which case it is then at least partially provided with an electrically insulating layer 15 (for example oxide layer or plastic layer, etc.).

As in the exemplary embodiment according to FIGS. 1 and 2, here too, the body 1 is fastened on a mounting surface 3 of the carrier plate 7 in such a way that it bears at least with part of its underside contact 22 on the electrically conductive terminal track 12 and is electrically conductively connected to the latter. Terminal parts 4', 5', which are electrically conductive, are fastened on the electrically conductive terminal tracks 12, 13, for example by means of soldering or adhesive bonding, with the result that the top sides 24, 25 of the terminal parts 4', 5' form the electrical terminal areas 16', 17' of the optoelectronic transducer.

The terminal parts 4', 5' are composed, for example, of high-conductivity silicon, metal or another material having high electrical conductivity. The binder used between the terminal parts 4', 5' and the electrically conductive terminal tracks 12, 13 is, for example, a metallic solder or an electrically conductive plastic. Equally, the terminal parts 4', 5' can be fastened on the terminal tracks 12, 13 by means of eutectic bonding.

Suitable materials for the carrier plate 7 and the electrically conductive terminal tracks 12, 13 are, for example, the materials correspondingly specified with regard to the first exemplary embodiment mentioned.

Here, too, the carrier plate 7 has, on its side opposite to the body 1, a means 21 for focusing the radiation which is emitted and/or received by the body. A diffraction optical system is illustrated in a manner representative of this in FIG. 3.

Furthermore, in this exemplary embodiment, too, the body 1 can be protected against moisture and against mechanical damage by means of a chip covering 27 (materials for the chip covering 27 as specified above with reference to FIG. 1).

Figure 5:
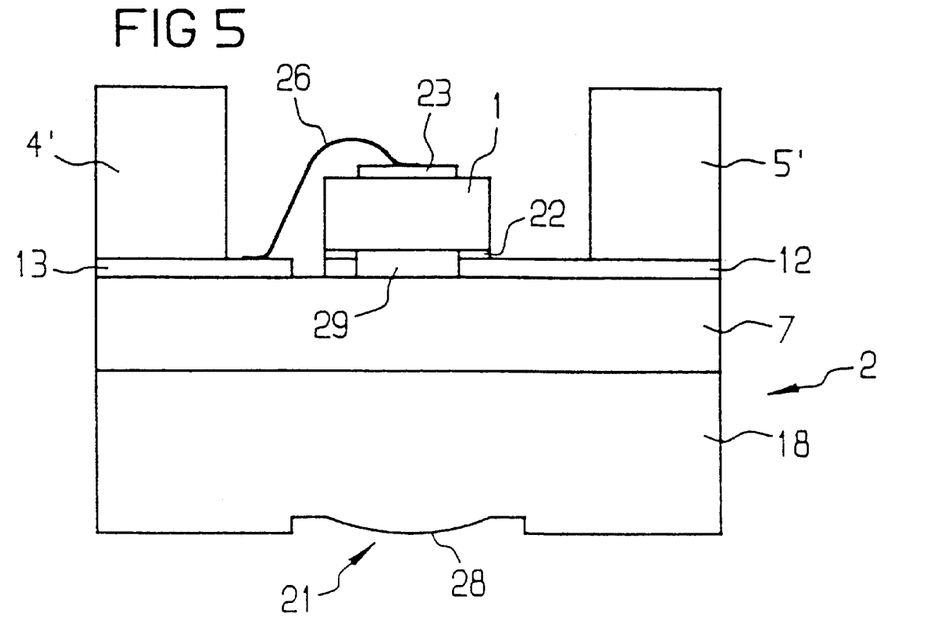
FIG. 5 is a diagrammatic sectional view taken through a third exemplary embodiment of the transducer according to the invention.

The exemplary embodiment of FIG. 5 differs from that of FIGS. 3 and 4 by virtue of the fact that a further plate 18 is arranged on that side of the carrier plate 7 which is opposite to the mounting surface 3. The further plate 18 is composed, for example, of a different material from the carrier plate 7. With a suitable selection of these materials, for example glass for the carrier plate 7 and silicon for the further plate 18, the high-frequency properties of the transducer can be improved and the capacitance of the optoelectronic transducer can be lowered. Moreover, by virtue of different refractive indices of the further plate 18 and of the carrier plate 7, it is possible to optimize the structural height and the optical imaging of the optoelectronic transducer.

As illustrated in FIG. 5, in this case the further plate 18, rather than the carrier plate 7, has a means 21 for focusing the radiation, in this case a spherical or an aspherical lens 28.

Figure 6:
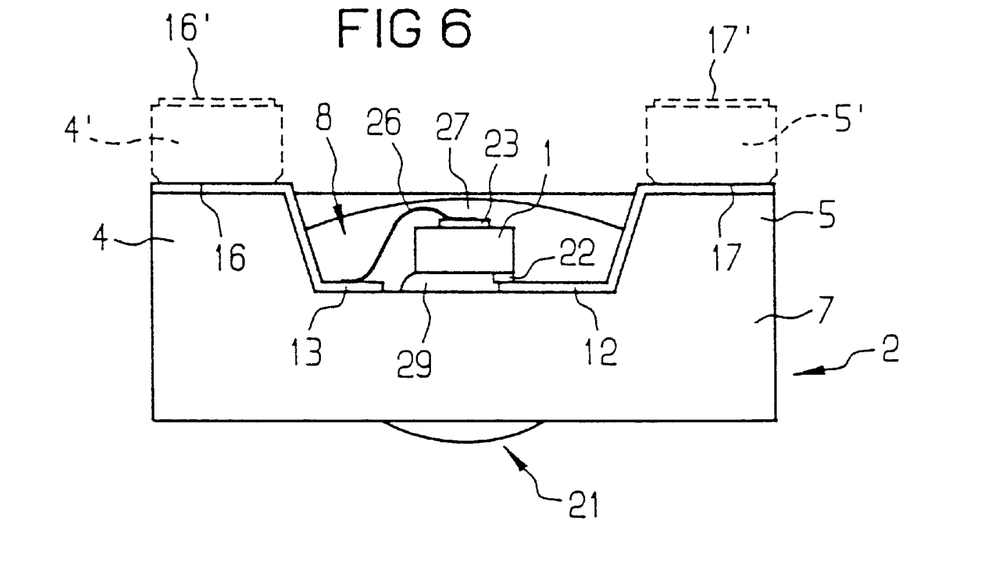
FIG. 6 is a similar view of a fourth exemplary embodiment thereof.
Figure 7:
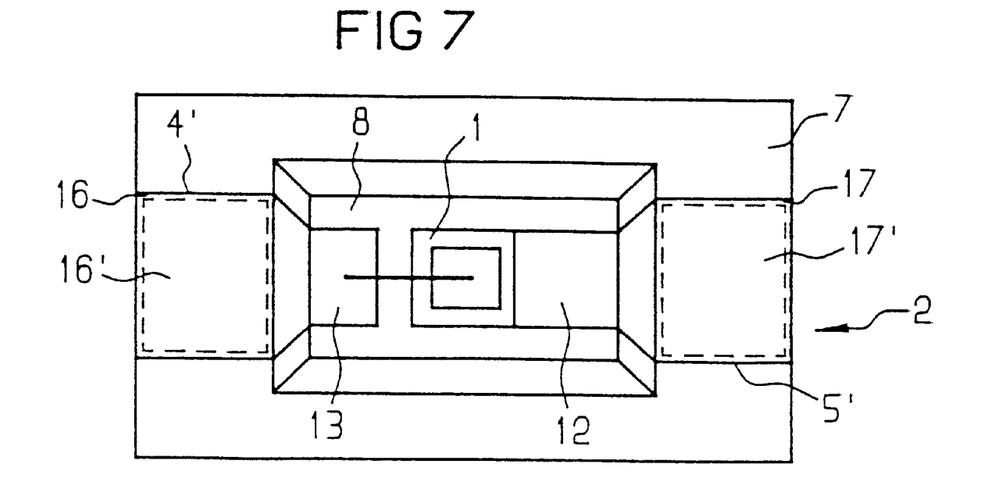
FIG. 7 is a diagrammatic plan view of the optoelectronic transducer of FIG. 6.

The exemplary embodiment according to FIGS. 6 and 7 differs from the embodiment of FIGS. 1 and 2 by virtue of the fact that the recess 8 in the carrier plate 7 has the form of a pit which becomes narrower from the top to the bottom and is produced by means of etching, for example. Portions of the side wall of the pit are in this case used as terminal parts 4, 5. This has the advantage that the terminal areas 16, 17 can be arranged as desired on the top side of the side wall of the pit, as a result of which, for example, the configuration of the conductor tracks on a printed circuit board assigned to the optoelectronic transducer is less restricted.

As in the exemplary embodiment according to FIG. 3, here, too, electrically conductive terminal parts 4', 5' (for example so-called silicon jumper chips) with terminal areas 16', 17' can be fastened on the terminal tracks 12, 13, the terminal areas 16', 17' being realized in the form of metal layers, for example.

On that side of the carrier plate 7 which is opposite to the pit, a separately produced spherical or aspherical lens is applied, for example by means of adhesive bonding, as the means 21 for focusing the radiation in this exemplary embodiment. Instead of the spherical or aspherical lens, a separately produced diffraction optical system can also be applied or formed in the carrier plate 7. The latter statement also applies, of course, to the spherical or aspherical lens.

Figure 8:
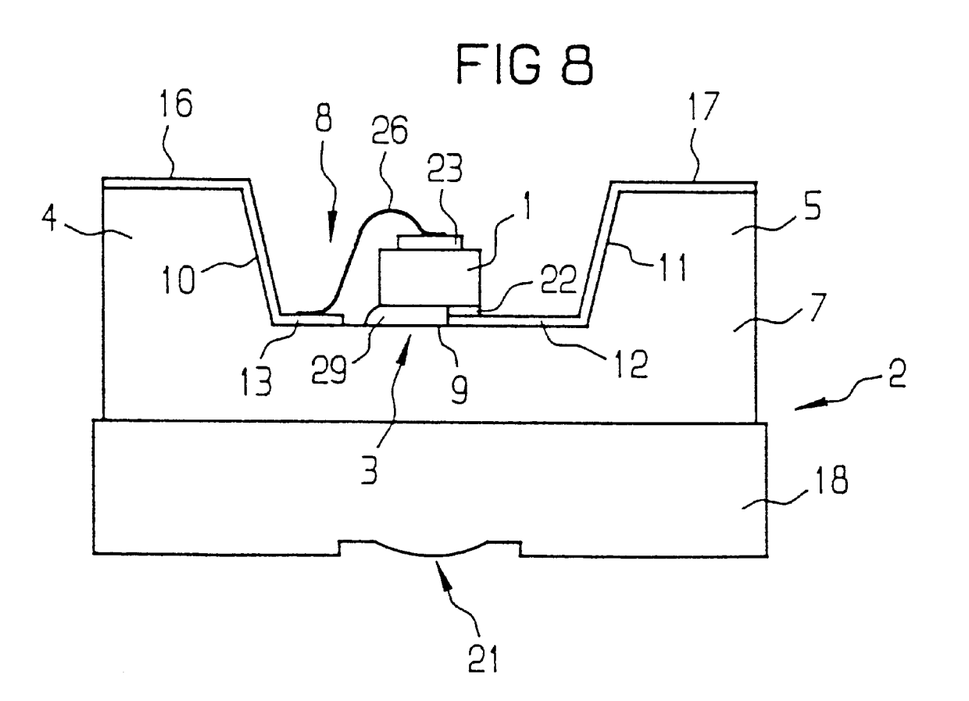
FIG. 8 is a diagrammatic sectional view taken through a fifth exemplary embodiment of the transducer according to the invention.

In the exemplary embodiment according to FIG. 8, the carrier plate 7 is designed essentially identically to the carrier plate of FIG. 1 (cf. the associated description). Equally, the carrier plate can be configured analogously to the exemplary embodiment of FIGS. 6 and 7. However, in addition to the carrier plate 7, the carrier unit 2 in this case has, as in the exemplary embodiment according to FIG. 5, a further plate 18 in which a means 21 for focusing radiation is formed or else can be applied. This embodiment consequently yields the same properties and additional advantages as for the exemplary embodiment of FIG. 5.

Figure 9A:
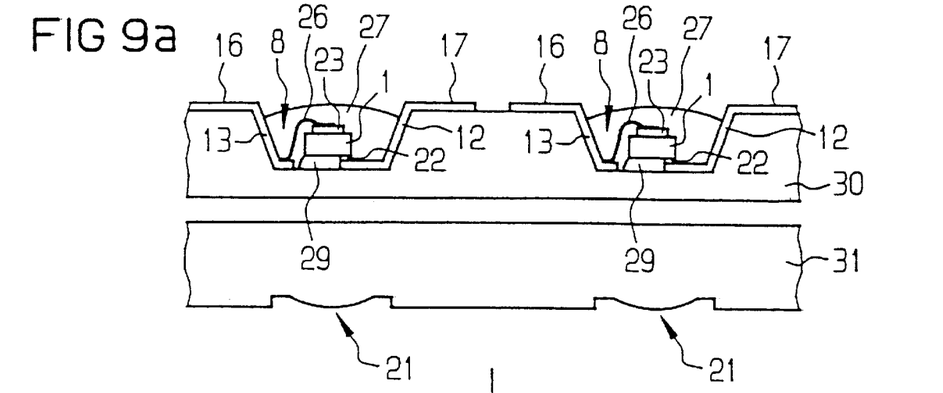
FIGS. 9a and 9b are diagrammatic views of a process sequence in the production of a plurality of transducers according to he embodiment of FIG. 8.
Figure 9B:
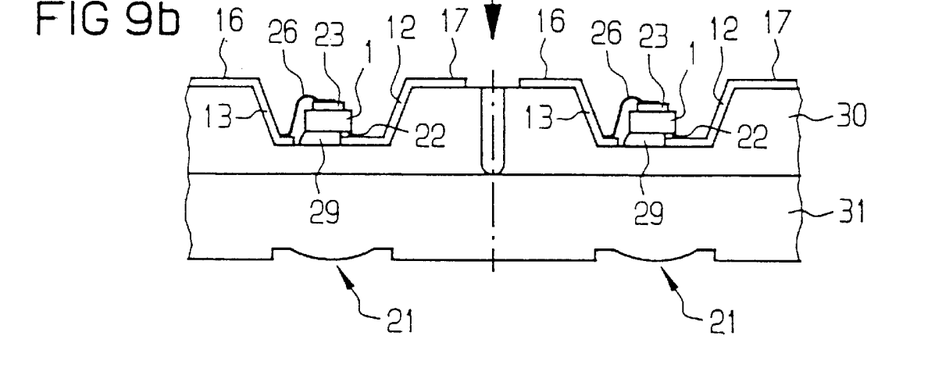

The process sequence for the simultaneous production of a plurality of optoelectronic transducers as shown in FIG. 8 will now be explained with reference to FIGS. 9a and 9b:

First, a plurality of recesses 8 are produced in a substrate plate 30, which is composed of the material for the carrier plates 7 (in this case glass, for example), for example by means of etching or milling.

A plurality of terminal tracks 12, 13 are then applied to partial regions of the surface of the carrier wafer 30, for example by means of mask technology and vapor deposition or sputtering.

As the next step, a plurality of bodies 1 are fastened in the recesses 8 and the contacts 22, 23 of the bodies are electrically conductively connected to the terminal tracks 12, 13, for example by means of an electrically conductive solder or by means of connecting conductors 26 (bonding wires).

If necessary, the interspaces between the radiation exit faces of the bodies 1 and the carrier wafer 30 are then each filled with a coupling medium 29 (for example resin). This can be done with a microdosing system, for example, by which the coupling medium is injected directly into the interspace.

If provided, the recesses 8 can then be filled with a casting resin or with an acrylate, with the result that the bodies 1 including the connecting conductors 26 are each provided with a chip covering 27.

Separately from the production of the carrier wafer 30 with the bodies 1, a wafer 31, which is composed of the material of the wafer 18 of FIG. 8, for example silicon, can be provided with a plurality of means 21 for focusing the radiation (production method as already specified above).

The wafer 31 is then connected to the carrier wafer 30, for example by means of soldering, adhesive bonding or anodic bonding. Equally, the wafer 31 may alternatively be connected to the carrier wafer 30 even before the bodies 1 are mounted onto said carrier wafer 30. The wafer composite is subsequently separated by means of sawing, for example.

The optoelectronic transducers can be electrically and optically tested prior to the separation of the substrate plate into individual units.

Figure 10:
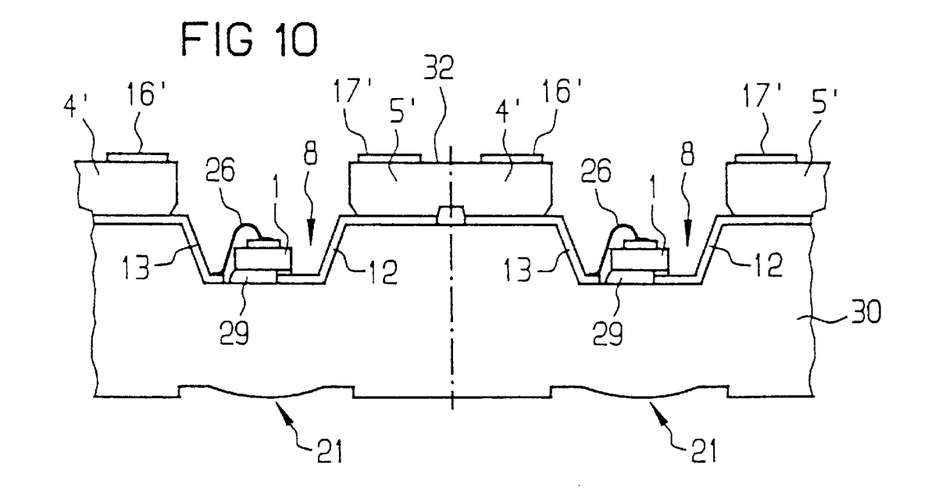
FIG. 10 is a diagrammatic side view illustrating a production process for a plurality of transducers according to FIG. 6.
Figure 11:
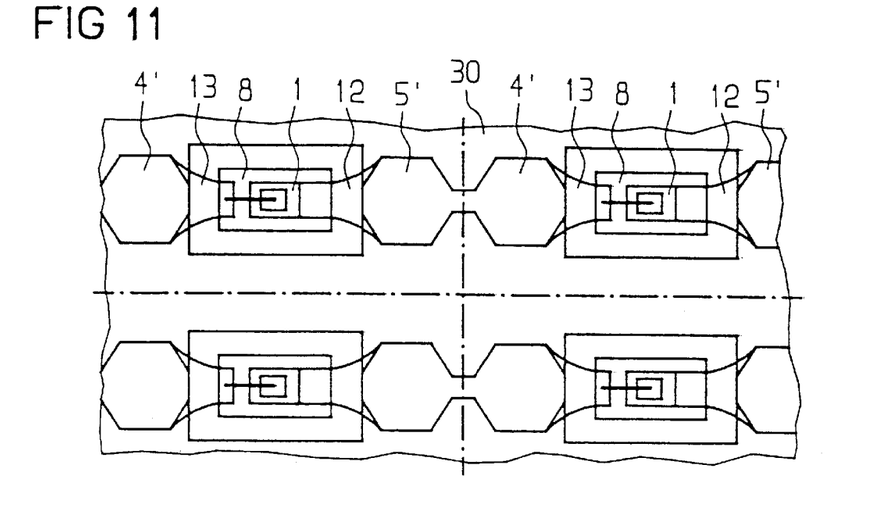
FIG. 11 is a top plan view illustrating a production process for a plurality of transducers according to FIG. 6.

In the method, explained below with reference to FIGS. 10 and 11, for the production of a plurality of optoelectronic transducers as shown in FIGS. 6 and 7, analogously to the method described above, a carrier wafer 30 is first provided with a plurality of recesses 8, a plurality of terminal tracks 12, 13 are applied to the top side of the carrier wafer 30 and a plurality of bodies 1 are fastened in the recesses. As far as the connection of the electrical contacts of the bodies 1 to the terminal tracks is concerned and as far as the coupling medium and chip covering are concerned, the specifications made with regard to FIG. 9 likewise apply.

The difference from the aforementioned method is that, firstly, in this case the means 21 for focusing the radiation are formed in the substrate plate or are applied to the latter and that, secondly, electrically conductive terminal parts 4', 5' connected to one another in pairs (terminal part pairs 32) with terminal areas 16', 17' (for example metal layers) are applied to the terminal tracks. The substrate plate 30 together with the terminal part pairs 32 is subsequently divided into individual optoelectronic transducers (after optional electrical and/or optical testing of the transducers).

We claim:

1. An optoelectronic transducer, comprising:

a carrier having a mounting surface;

at least one radiation-emitting and/or radiation-receiving body fastened on said mounting surface of said carrier, said body having electrical contacts;

a plurality of terminal parts assigned to said mounting surface, said terminal parts having electrical terminal areas each electrically conductively connected to one of said electrical contact of said body; and said terminal areas defining a contacting plane spaced from said mounting surface by a given distance, said body having a maximum height, measured from said mounting surface, less than said given distance from said mounting surface to said contacting plane.

2. The transducer according to claim 1, which further comprises electrical connectors connecting said electrical terminal areas with said electrical with contacts of said body, and wherein said height of said body measured from said mounting surface includes said electrical connectors.

3. The transducer according to claim 1, wherein said body is a semiconductor chip.

4. The transducer according to claim 1, wherein said body is a polymer luminescence diode.

5. The transducer according to claim 1, wherein said body is a laser diode.

6. The transducer according to claim 1, wherein said body is formed with a radiation port oriented towards said carrier, and wherein said carrier unit is composed of a material which is transparent to at least a portion of a radiation emitted and/or received by the body.

7. The transducer according to claim 1, wherein said carrier includes a carrier plate having a recess formed therein, said mounting surface defining a bottom of said recess, and said recess having side walls at least partially defining said terminal parts.

8. The transducer according to claim 7, wherein said carrier plate is formed of insulating material, and including a plurality of electrically conductive terminal tracks connected to said electrical contacts of said body, said terminal tracks being disposed in said recess and on said terminal parts and being structured in such a way that a number of terminal surfaces are formed on said terminal parts.

9. The transducer according to claim 7, which further comprises an insulating layer disposed in said recess and on said terminal parts, and a plurality of electrically conductive terminal tracks connected to said electrical contacts of said body, said terminal tracks being disposed on said insulating layer and forming terminal surfaces on said terminal parts.

10. The transducer according to claim 6, wherein said carrier includes means for focusing the radiation.

11. The transducer according to claim 1, wherein said carrier plate is formed of electrically insulating material, and including at least two electrically conductive tracks on said carrier plate, and electrically conductive terminal parts disposed on said terminal tracks.

12. The transducer according to claim 1, including an insulating layer at least partially covering said carrier plate, and at least two electrically conductive tracks on said insulating layer, and electrically conductive terminal parts disposed on said terminal tracks.

13. The transducer according to claim 1, wherein said carrier plate has a given refractive index, and including a further plate disposed on said carrier plate on a side thereof opposite from said body, said further plate having a refractive index different from said given refractive index.

14. The transducer according to claim 13, wherein said further plate includes radiation focussing means.

15. The transducer according to claim 1, which further comprises a cover disposed on said body.

16. A method of producing a plurality of optoelectronic transducers, which comprises:

a) forming a plurality of electrically conductive terminal tracks on a substrate, the terminal tracks defining a plurality of mounting surfaces;

b) mounting on the mounting surfaces a plurality of radiation-emitting and/or radiation-receiving bodies with electrical contacts, and electrically conductively connecting the electrical contacts of the bodies to respective terminal tracks; and c) placing a plurality of terminal parts on the substrate such that the terminal parts are each at least partially disposed on a respective terminal track and a height of the terminal parts measured from the mounting surfaces is greater than a height of the bodies.

17. The method according to claim 16, which comprises, prior to the forming step, placing an insulating layer on the substrate, and mounting the bodies on the insulating layer.

18. A method of producing a plurality of optoelectronic transducers, which comprises:

a) forming in a substrate a plurality of recesses with mounting surfaces;

b) producing a plurality of electrical terminal tracks with terminal areas on the substrate;

c) mounting a plurality of radiation-emitting and/or radiation-receiving bodies on the mounting surfaces in the recesses, such that a height of the terminal areas measured from the mounting surfaces is greater than a height of the bodies, and electrically connecting the bodies to the terminal tracks; and d) dividing and separating the substrate into individual optoelectronic transducers.

19. The method according to claim 18, wherein the separating step comprises sawing the substrate apart into individual transducers.

\* \* \* \* \*